United States Patent [19]

Kim et al.

[11] Patent Number: 5,028,971
[45] Date of Patent: Jul. 2, 1991

[54] HIGH POWER PHOTOCONDUCTOR BULK GAAS SWITCH

[75] Inventors: Anderson H. Kim, Toms River; Maurice Weiner, Ocean; Robert J. Youmans, Brick; Robert J. Zeto, Eatontown; Michelle A. Dornath-Mohr, Freehold; Melvin J. Wade, Tinton Falls, all of N.J.

[73] Assignee: The United States of America as represented by the Secretary of the Army, Washington, D.C.

[21] Appl. No.: 532,786

[22] Filed: Jun. 4, 1990

[51] Int. Cl.⁵ .............................. H01L 27/14
[52] U.S. Cl. ........................ 357/30; 357/19; 357/17; 250/211 R
[58] Field of Search ........... 357/30 Q, 30 P, 30 D, 357/30 R, 19, 16, 17, 68; 250/551, 211 R, 211 J

[56] References Cited

U.S. PATENT DOCUMENTS

| | | | |
|---|---|---|---|
| 3,053,926 | 9/1962 | Ben-Sira et al. | 357/30 Q X |
| 3,529,161 | 9/1970 | Oosthoek et al. | 357/30 Q X |
| 4,633,286 | 12/1986 | Bovino | 357/30 Q |
| 4,695,733 | 9/1987 | Pesavento | 250/551 |
| 4,864,119 | 9/1989 | Ragle et al. | 250/211 R |

FOREIGN PATENT DOCUMENTS

| | | | |
|---|---|---|---|
| 57-12570 | 1/1982 | Japan | 357/30 Q |
| 58-30171 | 2/1983 | Japan | 357/30 Q |
| 8800397 | 1/1988 | PCT Int'l Appl. | 357/30 Q |

OTHER PUBLICATIONS

Kim et al, "High Power RF Generation With Optically Activated Bulk GaAs Devices," 1988 IEEE MTT-S Digest, pp. 1071-1074.
Kim et al, "Bulk GaAs Photonic Devices With Two Opposite Electrodes," Jun. 1989, IEEE Pulsed Power Conference, IEEE Catalog No. 89CH2678-2, pp. 430-432.

Primary Examiner—William Mintel
Attorney, Agent, or Firm—Michael Zelenka

[57] ABSTRACT

A photoconductive switch with a low threshold energy, high voltage capability and fast rise time consisting of a semiconductive substrate comprised primarily of gallium arsenide, patterned electrodes masked onto the substrate on opposite sides, a power supply and a laser that introduces laser light via fiber optic bundles to the substrate and parallel to the applied electric field.

10 Claims, 6 Drawing Sheets

FIG. 6

HIGH POWER PHOTOCONDUCTOR BULK GAAS SWITCH

The invention described herein may be manufactured, used, and licensed by the Government of the U.S. for governmental purposes without the payment to us of any royalties thereon.

FIELD OF THE INVENTION

The present invention relates generally to photoconductive devices, particularly to high peak power photoconductive devices for use in impulse radars and high power microwave generation devices, and more particularly to photoconductive bulk gallium arsenide switches.

BACKGROUND OF THE INVENTION

It is generally known that a high dark resistivity semiconductor can be transformed from semi-insulating state to a quasi metallic state almost instantaneously when it is illuminated by picosecond or femtosecond optical pulses. Due to this property, high resistivity semiconductors have been widely used as photoconductive optically activated switches (OAS) because they are able to provide fast risetime, low jitter and high power capabilities. These qualities have proved most advantageous in devices that produce high intensity microwaves. There are, however, many other applications for these switches, for example, time domain meteorology, counter measure devices and plasma generation and diagnostics.

Most of these applications involve kilovolt sequential wave form generation by pico second optoelectric switching, direct DC to RF conversions by impulse excitations of a resonant cavity or high speed optoelectric modulation of millimeter waves. One oft cited example of generating RF signals by laser illumination was described by Chang et al in "Direct DC to RF Conversion by Picosecond Optoelectric Switching", IEEE MTT-S International Microwave Symposium Digest, May 1984, wherein the laser illumination was accomplished in a three stage "frozen wave" configuration. From the Chang description, it is readily apparent that the switch used to discharge the energy store is a most critical component in the pulse power system and is generally considered the single limiting factor of the system. In applications requiring more than one switch, such as the Marx Generator or the Frozen Wave Generator described by Chang, there are three critical properties that the switches must exhibit. These are large voltage hold-off, large effective quantum efficiency and fast risetime.

One type of switch that has been used in microwave generation systems with the aforementioned qualities is a semi-insulating gallium arsenide device as disclosed in SIR H695, Weiner, et al, issued Oct. 3, 1989. The gallium arsenide material used in these devices has a very high resitivity that has the capability to withstand high voltages even without laser light illumination. With laser illumination, this device has relatively high ever, large amounts of optical energy are required to activate this switch. Due to this inefficiency, the means for generating the necessary optical energy is expensive and bulky.

As a modification of the Weiner et al optically activated switch, an optically activated gridded bulk silicon pin diode, as described in "Optically Activated Switch for MM Wave and Laser Transmitters", Final Report, US Army Contract DAAL01-85-C0421, SRI, Princeton, New Jersey, was developed to enhance the RF output in frozen wave generators. Since the development of this device it has been realized that although silicon switches provide several advantages such as relative low cost and ease of manufacture, gallium arsenide provides several performance advantages not capable in silicon switches.

One major advantage of using gallium arsenide in OAS devices is that it can be obtained with resistivities greater than $1 \times 10^7$ ohm-centimeter. This quality eliminates the problem of thermal breakdown and permits the device to be DC biased, thus significantly simplifying the pulser circuitry. Another advantage is that semi-insulating galiium arsenide contains numerous impurities which give rise to high densities of mid-band energy levels. High carrier densities can, therefore, be generated with optical radiation that has photon energy below the band gap of gallium arsenile. This results in very long absorption lengths and permits bulk rather than surface conduction. A high current switch can thus be thick rather than wide and the illuminated area can be kept to a minimum.

Accordingly, it is an object of those who design optically activated switches to increase the resistivity of the device during the off-state, while being able to activate the switch at relatively low energy levels and to provide increases in risetime and voltage capability. The invention described herein addresses these objectives.

SUMMARY OF THE INVENTION

It is an objective of this invention to provide a fast risetime and high voltage capability for optically activated switches.

It is another objective of this invention to provide a gallium arsenide switch with a increased gap distance between electrodes so as to permit an optically activated switch to be thick.

These and other objectives are accomplished by the present invention wherein a bulk piece of high resistivity semiconductor, for example, gallium arsenide, is masked with a gridded electrode on either one or both sides of the semiconductor. The gridded electrodes are electrically connected to a power supply means. The gridded electrode ideally distributes the electric field uniformly over the entire active switching area. If only one side of the semiconductor is masked with a gridded electrode, the opposite side of the semiconductor is masked with a single electrode comparable in size to the gridded electrode. The pattern of electrodes should be designed to permit as much light penetration as possible throughout the active area of the semiconductor. This is optimally achieved by the pattern shown in FIG. 6.

The semiconductor switch is fabricated such that a gridded electrode is either photolithographically or mechanically masked onto a substrate of a semiconductor material, preferably gallium arsenide.

In operation, laser light is introduced to the switch parallel to the applied electric field via fiber optic bundles. Experimental results showed that an exposure ratio of forty to sixty percent gave the maximum switching efficiency. The switching rate is significantly improved by masking both sides of the semiconductor with gridded electrodes and exposing both sides of the semiconductor with laser light parallel to the applied field. The switching risetime and laser threshold energy for one side versus two side illumination were measured for 7 mm gap distance photoconductive switches. The experimental results showed faster risetime for the device with both sides being masked with gridded electrodes. The measured absorption length of a Neodymium-doped Yttrium Aluminum Garnet (Nd:YAG) laser at 1.06 microns wavelength is 4.32 mm. Thus, the effective gap distance, even under a high electric field, is 5 to 7 mm. In general, the voltage capability of these switches is proportional to the gap distance between the electrodes and therefore, to increase the voltage capability, it is necessary to increase the gap distances.

Generally, the minimum amount of optical energy needed to activate an optically activated switch is termed the threshold optical energy. The conventional high power optically activated switch, as mentioned above, has a very high threshold optical energy. The present invention, however, has a very low threshold energy. Experimental results revealed that the present optically activated switch may be activated at 0.8 mj, using a 1.06 um laser emission wavelength.

Accordingly, the present invention permits RF generation with a switching device that requires only a minimal threshold optical energy, but provides long recovery and a high voltage hold off capability as well as improved efficiency.

DETAILED DESCRIPTION OF THE INVENTION

Figure 1:
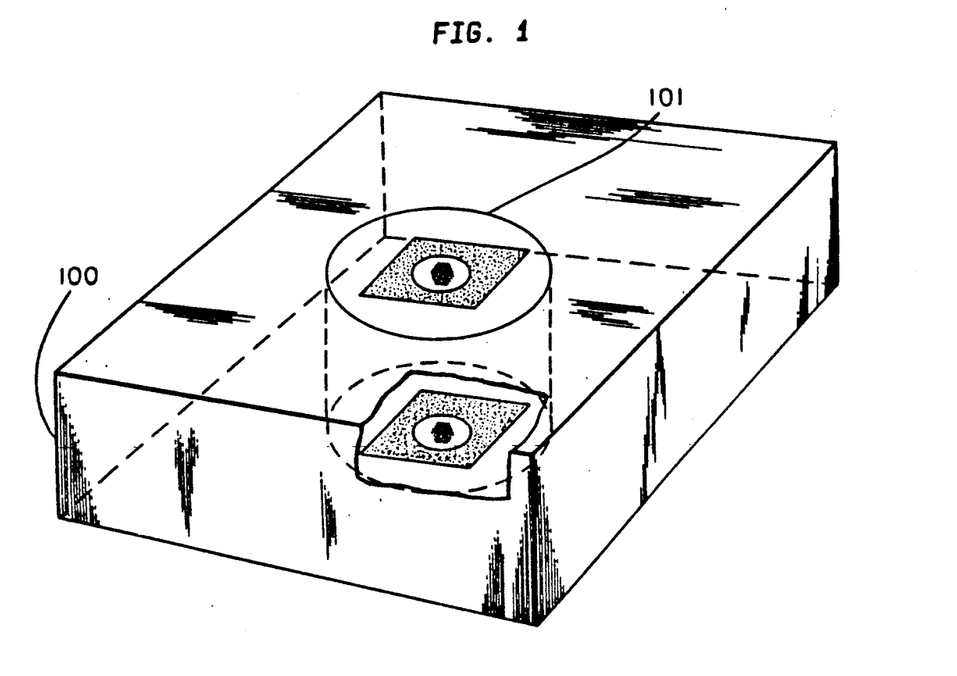
FIG. 1 is a perspective view of one embodiment of the present invention.

FIG. 1 is a perspective view of one embodiment of the present invention. The major components of the invention are a semiconductive substrate 100, preferably gallium arsenide, gridded electrode(s) 101 deposited on the semiconductive substrate such that the electrodes permit light absorption, and a light source (not shown), preferably laser light delivered by fiber optic bundles. Although the gridded electrode(s) 101 may be masked onto the substrate in any pattern that permits light absorption through the substrate 100, experimental results have shown that the pattern exhibited in FIG. 6 has yielded the maximum efficiency to date.

The present invention may be fabricated by masking the electrode(s) 101 onto the substrate 100 either lithographically or mechanically. For the mechanical masking, a metal mask, preferably stainless steel, is fabricated by conventional machine tools in the pattern desired. Then, a layer of metal, such as aluminum, is deposited on the mechanical mask. Thereafter, layers of varying metals are evaporated on the masked semiconductor substrate at high vacuum conditions, preferably these layers are a layer of nickel (preferably 50 A), a layer of Germanium (preferably 300 A), a layer of gold (preferably 600 A), a layer of silver (preferably 1000 A), and second layer of gold (preferably 2000 A). After evaporation of the metal layers, the semiconductor wafer is cut into the desired shape of the optically activated switch. To create the gridded pattern, the switch is exposed to an acetone which removes the aluminum in the selected pattern. The switch is then annealed, preferably by maintaining the switch at a temperature of 450 C for several minutes.

Figure 6:
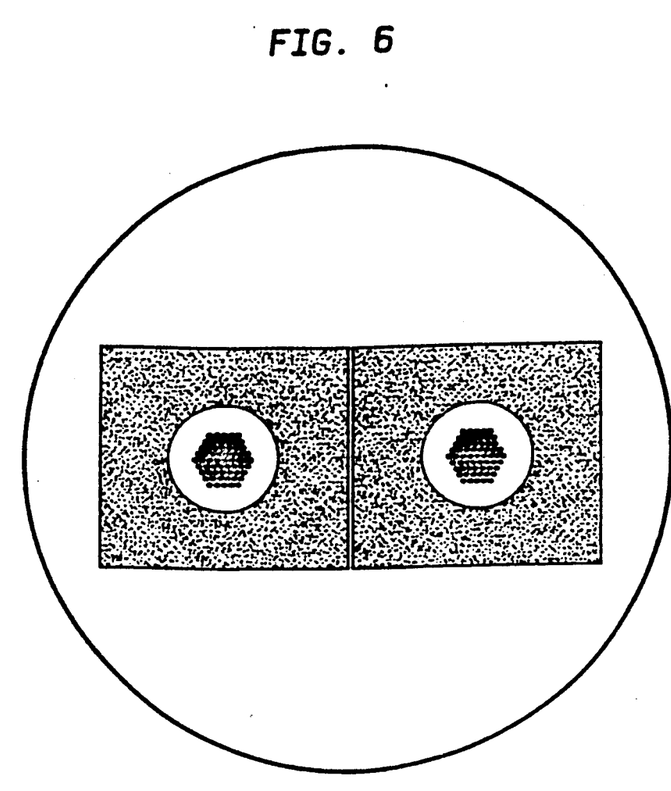
FIG. 6 is a representation of one pattern of electrodes which may be utilized in the present invention.

Although the electrode(s) may be photolithographically masked onto the switch using numerous methods, the following is a description of the photolithographic masking procedure used to create the optically activated switches shown in FIG. 6:

The switches were fabricated by Class 100 clean room processing of chem-mechanically polished semi-insulating (100) gallium arsenide wafers from M/A-COM. The gallium arsenide had a resistivity of 4E7 ohm-centimeters with dimensions of 5.1 centimeters diameter and 0.5 centimeter thickness. Two switches, each 2.2 centimeters on edge, were obtained from each wafer by a photoresist lift-over process. Orthogonal saw cuts served as a reference for the alignment of the front and back electrode patterns which had a 1.0 centimeter outer diameter. The electrode apertures, 586 microns in diameter and separated by 150 microns, were located within an area with an 0.6 centimeter diameter. The switches were ultrasonically cleaned with organic solvents and deionized water and then patterned with a Kasper contact aligner using Hunts 1350J photoresist. After the photoresist pattern was made on both sides, each face of the switch was metallized with 50 A nickel, 300 A germanium, 600 A gold, 1000 A silver and 1000 A gold. Finally, the photoresist and excess metal were lifted off by ultrasonic immersion in acetone, leaving the gridded aperture electrode patterns.

Although the present invention may be utilized by masking only one side of the semiconductor substrate with an electrode, experimental results have shown that by masking opposite sides of the semiconductor substrate the voltage capability and switching speed are greatly enhanced. In addition, opposite side masking creates a highly symmetric carrier density distribution throughout the semiconductor substrate. A symmetric carrier density lessens the likelihood of destructive break down normally associated with localized field enhancement at the edge of the electrodes. In this regard, it is anticipated that the semiconductor substrate may be masked with any number of patterned electrodes on any of its surfaces.

Figure 2:
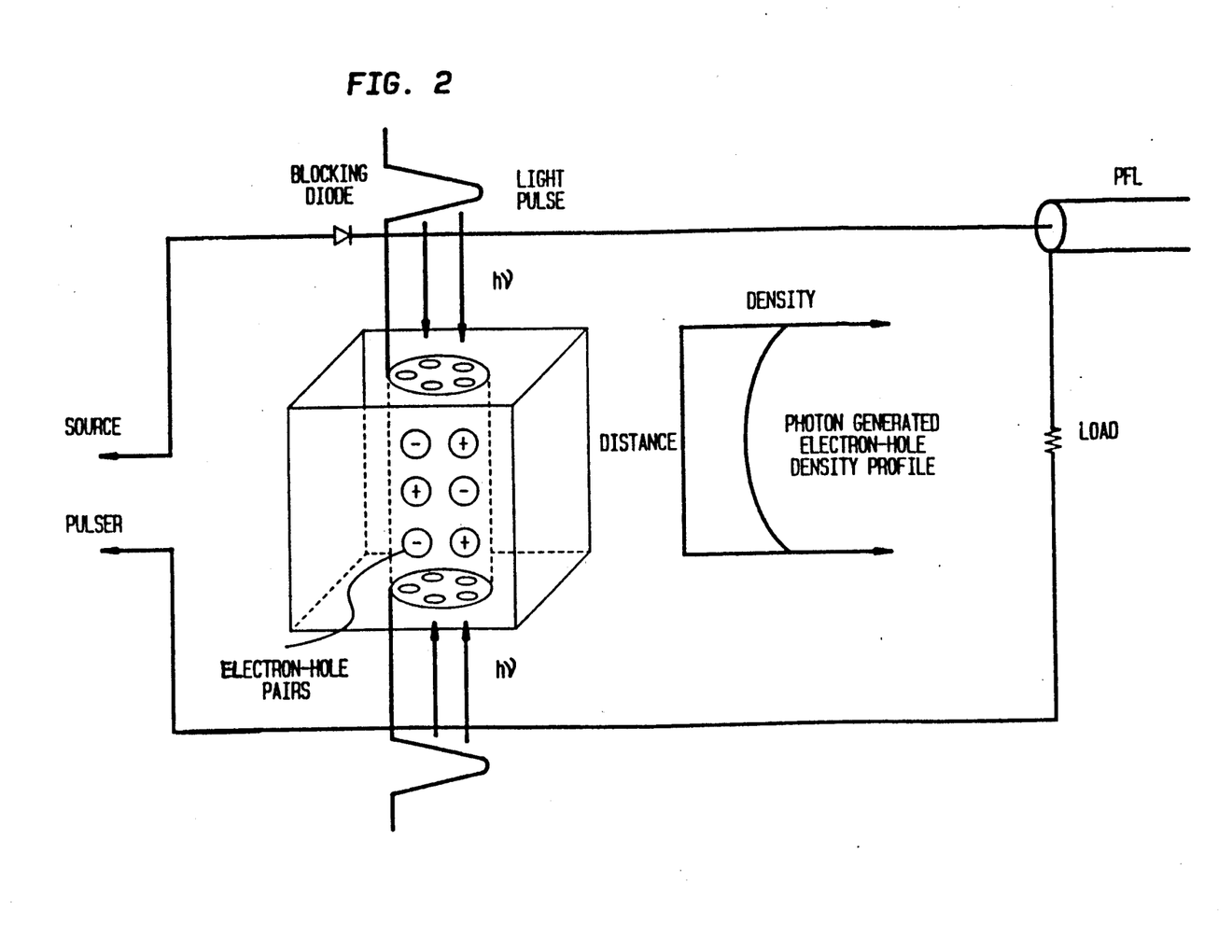
FIG. 2 is a schematic diagram of a circuit that employs the present invention.

FIG. 2 is a schematic representation of a test circuit used in experiments to determine the effectiveness of the present invention. This test circuit is analogous to a circuit in which the present invention may be incorporated in an RF generator. As shown, light pulses are directed across the switch parallel to the electric field direction. In the preferred embodiment of the invention, this is accomplished by utilizing bundles of fiber optic cables that are coupled to the electrodes. The advantage of using fiber optic bundles is to insure that a sufficient amount of light is being introduced to the switch. Each fiber optic bundle may contain varying fiber optic lengths, thus effectively increasing the width of the light pulse and insuring the switch stays on, until all forward and backward light waves pas through the switch. The electrode voltage hV is applied across the electrodes via charged coaxial transmission lines PFL. When the light pulse is introduced to the switch, the electrical resistance of the semiconductive material is decreased through electron holes, and the resistance change is translated into a change in the current that flows through the output circuit. This resistance change is represented by the photon generated electron hole density profile of the present invention as shown in FIG. 2.

An RF generator in which the present photoconductive switch may be used is disclosed in SIR H843, published by Kim et al on Nov. 6, 1990 and filed May 26,1989. In operation, a high electric field is applied across the gridded electrodes and then laser light is introduced to the switches parallel to the applied electrical field. The patterned electrodes uniformly distribute the electric field over the entire active switching area. Experimental data showed that an exposure ratio of the semiconductor substrate of forty to sixty percent gave the maximum switching efficiency. Incorporating this ratio into the electrode pattern design for the mask, the design as shown in FIG. 8 proved to be the most efficient.

The RF generator itself consists of charged coaxial transmission lines (PFL) and the gridded optically activated switches employed in this invention. As shown in FIG. 1 of SIR H843, the circuit has three segments of PFL's charged by positive and negative voltage Vo. Adjacent PFL's are connected with the present invention. Since semi-insulating gallium arsenide has a high resistivity, the leakage current is negligible. When all the switches are activated simultaneously, the standing waves, which typically have an amplitude of Vo/2, start to move in the forward and backward directions. The forward wave travels toward the output load and appears on the load resistor. The backward wave moves toward the open termination end, is totally reflected from the open termination end, and then moves back toward the output load. The half period of the RF generated is the transmit time for the standing wave to travel across the PFL of length L. The repetition frequency of the burst of RF is determined by the repetition rate of the laser system. The predicted generation of the RF burst is given in FIG. 2 of SIR H843.

In conventional high power bulk optically activated switches the light is introduced perpendicular to the applied electrical field direction. Utilizing the present invention, as mentioned previously, the light is applied parallel to the applied electrical field direction. Test results have shown that this alteration significantly improves the efficiency of the optically activated switch. In one test utilizing a single sided gridded electrode and with light from a 20 ns Q-switched Nd:YAG laser emanating from a fiber optic bundle, the switch activation was sustained for 150 ns without distortion. As stated previously, the optically activated switch utilizing gridded electrodes on opposite sides of the semiconductor substrate proved to have even a further superior risetime as compared to the single sided optically activated switch. For a more detailed comparison of the single and double sided optically activated switches see, Kim et al, Bulk GaAs Photonic Devices with Two Opposite Gridded Electrodes, IEEE Catalog No. 89CH2678-2, 1989 and for a more detailed discussion of the single sided optically activated switches as utilized in an RF generator see, Kim et al, High Power RF Generation with Optically activated Bulk GaAs Devices, 1988 IEEE MTT-S Digest, Page 1071.

Figure 3:
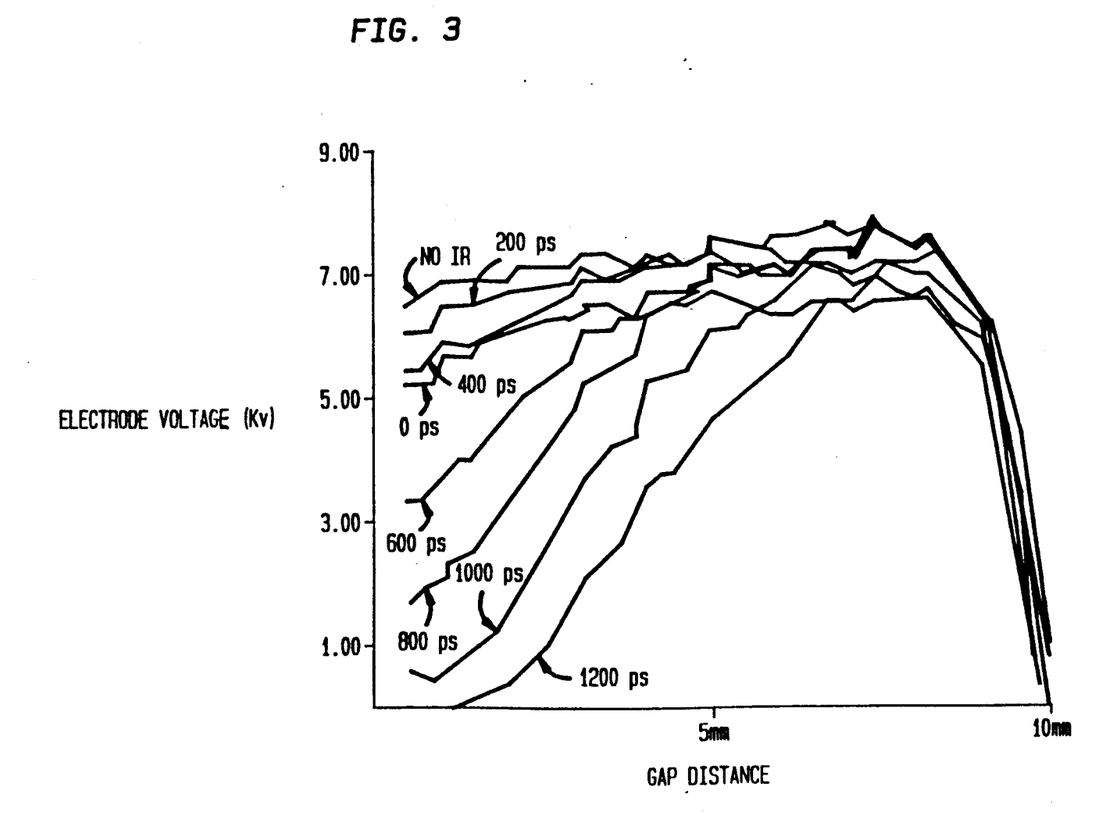
FIG. 3 is a graph representing the electrical field profile obtained with a switch having a masked electrode on a single side.
Figure 4:
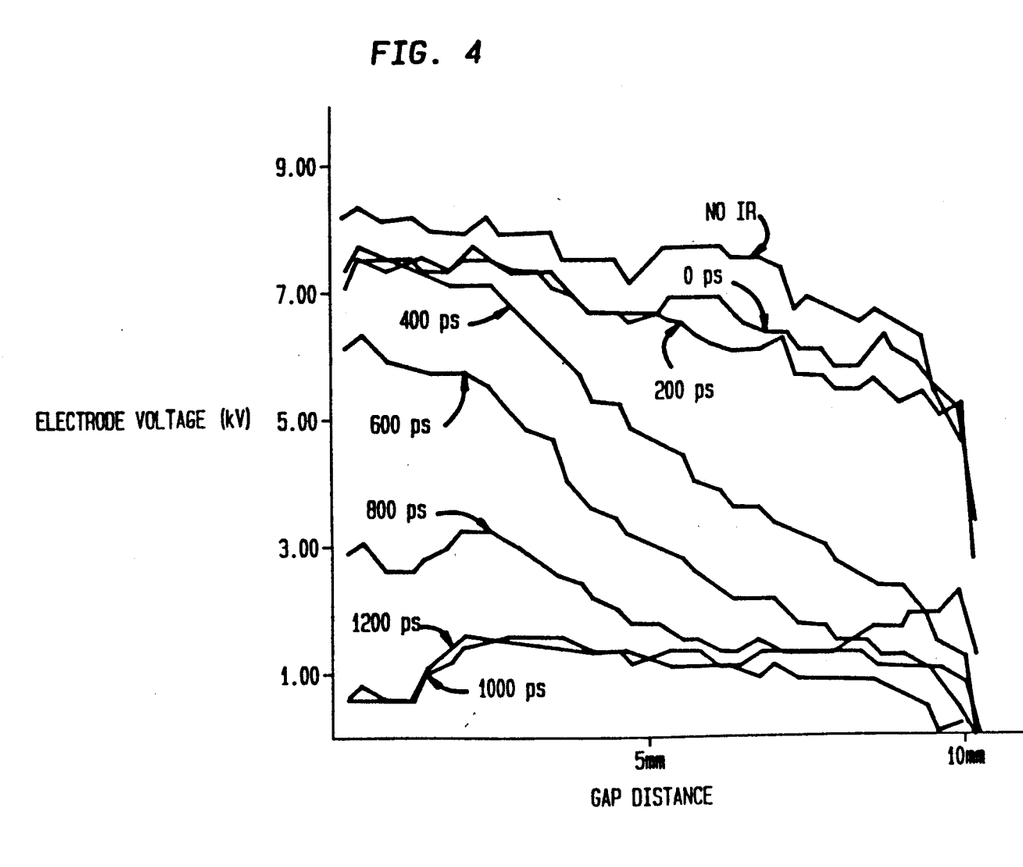
FIG. 4 is a graph representing an electrical field profile obtained with a switch having masked electrodes on opposite sides.
Figure 5:
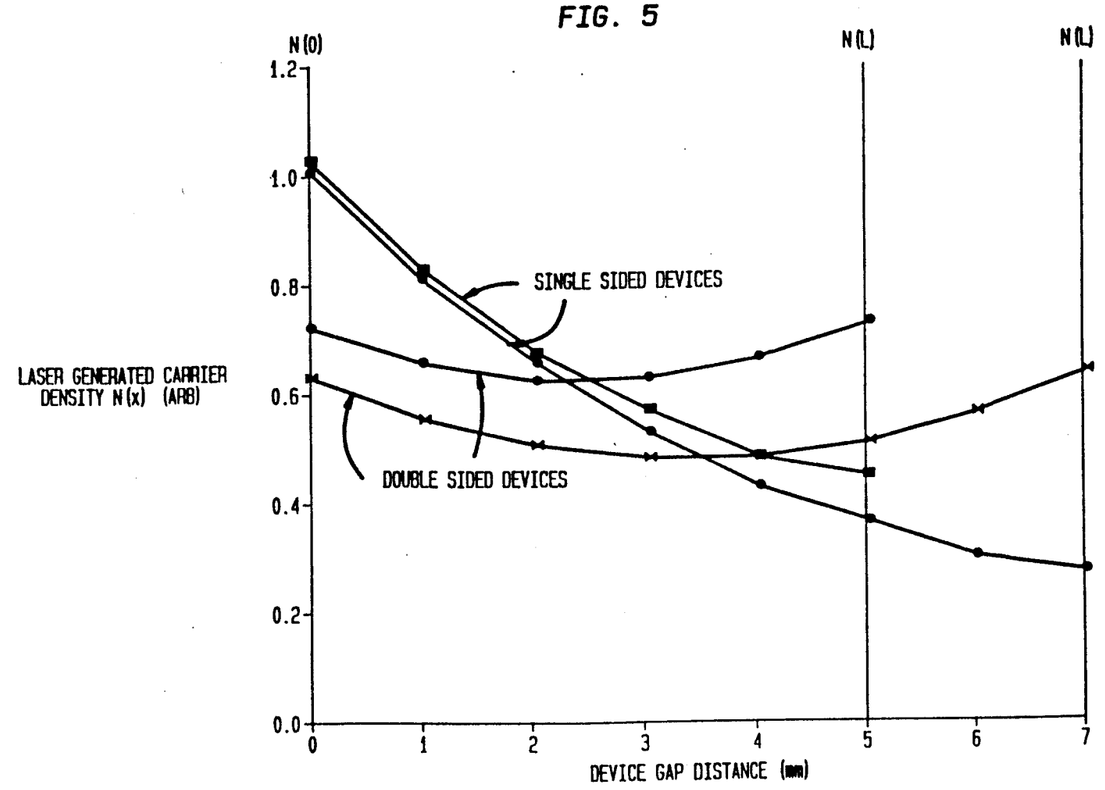
FIG. 5 is a graphic comparison of calculated photons generated carrier densities for a single and double sided gridded electrode devices.

FIGS. 3 and 4 are graphs representing the electrical field profiles obtained with switches having a single gridded electrode and double gridded electrodes, respectfully. FIG. 5 is a graphic comparison of calculated photons generated carrie densities for single and double sided gridded electron devices.

While the invention has been understood with respect to a specific embodiment, it should be understood that other variations may be made in the particular designs and configurations without departing from the scope of the invention a set forth in the appended claims and their equivalents.

What is claimed is:

1. A photoconductive switch comprising:
   a substrate of semiconductive material having at least two opposite surfaces;
   a first patterned electrode placed onto a first surface of said substrate;
   a second patterned electrode placed onto a second surface of said substrate opposite said first surface;
   a power supply means for providing an electric field in a predetermined direction across the first and second patterned electrodes; and
   means by which the two opposite surfaces of the substrate are exposed to a radiation source of a predetermined wavelength such that said radiation is absorbed by said substrate.

2. The photoconductive switch as in claim 1 wherein the substrate consists primarily of gallium arsenide.

3. The photoconductive switch as in claim 1 wherein the radiation source is directed parallel to the direction of said electric field.

4. The photoconductive switch as in claim 1 wherein said first and second patterned electrodes are patterned such that forty to sixty percent of the substrate is exposed to said radiation source.

5. The photoconductive switch as in claim 1 wherein said radiation source emanates from a laser and is delivered from the laser via a bundle of at least one fiber optic cable.

6. A photoconuctive switch comprising:
   a substrate of semiconductive material having at least two opposite surfaces;
   a plurality of patterned electrodes placed onto at least two surfaces of aid substrate;
   a power supply means for providing an electric field in a predetermined direction across the plurality of electrodes; and
   means by which at least two opposite surfaces of the substrate are exposed to a radiation source of predetermined wavelength such that said radiation sourced is absorbed by said substrate.

7. The photoconuctive switch as in claim 6 wherein the substrate consists primarily of gallium arsenide.

8. A photoconductive switch as in claim 3 wherein the first and second patterned electrodes are comprised of a first layer of nickel, a layer of germanium, a first layer of gold, a layer of silver, and a second layer of gold.

9. A photoconuctive switch as in claim 8 wherein the first and second patterned electrodes are patterned in the manner exhibited in FIG. 6 herein.

10. A photoconuctive switch as in claim 90 wherein the first and second electrodes have a outer diameter and about 1 centimeter and wherein the pattern exhibited has apertures which are about 586 microns in diameter and are separated by about 150 microns.

* * * * *

UNITED STATES PATENT AND TRADEMARK OFFICE
CERTIFICATE OF CORRECTION

PATENT NO. : 5,028,971

DATED : Jul 02, 1991

INVENTOR(S) : ANDERSON H. KIM, MAURICE WEINER, ROBERT J. ZETO, MICHELLE A. DORNATH-MOHR, MELVIN J. WADE

It is certified that error appears in the above-identified patent and that said Letters Patent is hereby corrected as shown below:

Column 1, line 61, after "high" insert --switch rates, a fast risetime, and high power capability. How--;

Column 2, line 16, "galiium" should read --gallium--;

line 20, "arsenile" should read --arsenide--;

Column 4, line 65, "pas" should read --pass--;

Column 6, line 5, "carrie" should read --carrier--;

line 63, "90" should read --9--.

Signed and Sealed this

Thirteenth Day of October, 1992

Attest:

DOUGLAS B. COMER

*Attesting Officer*      *Acting Commissioner of Patents and Trademarks*